United States Patent [19]

Wanlass

[11] 4,025,800

[45] May 24, 1977

[54] BINARY FREQUENCY DIVIDER

[75] Inventor: Frank Marion Wanlass, Cupertino, Calif.

[73] Assignee: Integrated Technology Corporation, Sunnyvale, Calif.

[22] Filed: June 16, 1975

[21] Appl. No.: 587,241

[52] U.S. Cl. .......................... 307/225 C; 307/214; 307/279

[51] Int. Cl.² .................... H03K 23/8; H03K 27/00

[58] Field of Search ....... 307/220 C, 221 C, 225 C, 307/214, 279

[56] References Cited

UNITED STATES PATENTS

| 3,558,366 | 1/1971 | Lepselter | 357/51 |
| 3,560,998 | 2/1971 | Walton | 307/225 C |
| 3,766,408 | 10/1973 | Suzuki et al. | 307/223 C |
| 3,823,551 | 7/1974 | Riehl | 58/50 R |
| 3,922,566 | 11/1975 | Kodama et al. | 307/225 C |

OTHER PUBLICATIONS

"Integrated Circuits" by Hibberd, (McGraw-Hill) Texas Instruments Electronics Series (copyright 1969) p. 38.

*Primary Examiner*—Stanley D. Miller, Jr.

[57] ABSTRACT

A binary divider circuit consisting of a pair of inverters connected in series and a pair of switches connected in series around one of the inverters. The switches are constructed such that they are not open or closed at the same time and a capacitor is connected from the common node between the switches and ground. A resistor is connected from the output of one of the series inverters to the input of the other inverter. The resistor is of a value such that the time constant is associated with the resistor and capacitor.

7 Claims, 11 Drawing Figures

BINARY FREQUENCY DIVIDER

BACKGROUND OF THE INVENTION

Modern electronic watches consist of an accurate electronic frequency source; CMOS divider circuitry for reducing the reference frequency to a one cycle per second signal; CMOS counters for counting minutes, seconds, hours, days, months and so on; CMOS control circuitry; and electronic displays such as a liquid crystal or light emitting diodes. This is all old. The new developments in electronic watches are occurring primarily as improvements in displays, size reduction of the circuitry, and reductions in manufacturing costs. The present invention is directed at two of these areas: namely the reduction in both size and manufacturing costs of the divider circuitry.

The divider circuitry typically consists of a series of CMOS binary divider circuits that have the property of dividing the frequency of the input signal precisely in half. That is, if the input signal frequency is 4 Hz, the output signal frequency would be 2 Hz. These circuits, although conceptually simple and old in the art, are uniquely important to digital watch design became many are required in a single watch and both space and power are limited.

Thus, it is an object of this invention to provide an improved binary circuit that is smaller in size than those currently available. Smaller size will provide higher yields and lower cost.

It is another object of the invention to provide a new binary circuit that is uniquely suited for the low power complementary meta oxide semiconductor (CMOS) process of implementation.

It is another object of the invention to provide a binary divider circuit with a minimum number of active elements.

Finally, it is an object of the invention to provide a new structure for a capacitor in CMOS.

SUMMARY OF THE INVENTION

These and other objects of the invention are achieved by a circuit having first and second inverters in series with the output of the second inverter fed back through a high value resistor to the input of the first inverter. In addition, the input of the first inverter is connected in series through first and second switches to its own output. A capacitor is connected from the common node between the two switches to ground. One input, consisting of a logic signal, is supplied to the control terminal of the first switch and a second input signal, consisting of the complement of the first control signal, is supplied to the control terminal of the second switch. The circuit output is taken from the second inverter and its complement from the first inverter.

This circuit, when implemented in CMOS technology, utilizes a capacitor structure that consists of a reverse biased p+, n++ diode, the capacitive value of which is large when compared with that of the stray capacitance associated with the input to the first inverter.

DESCRIPTION OF THE PREFERRED EMBODIMENT

Figure 1:
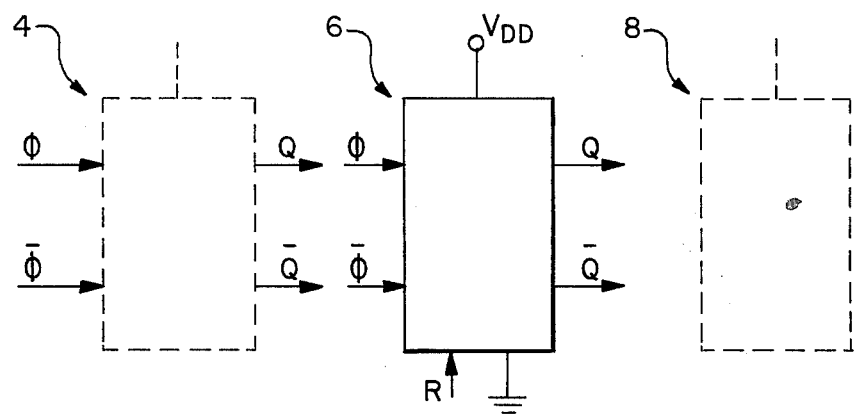
FIG. 1 is a block diagram of the inverter circuit of the present invention, particularly showing its inputs and outputs.

FIG. 1 generally shows the setting of the invention as one circuit 6 in a plurality of identical binary frequency divider circuits 4 and 8. The output of a frequency reference such as a quartz crystal (not shown) is supplied to the input of a chain of binary divider circuits 4, 6 and 8. The output of the frequency reference may be a signle signal consisting of a sequence of pulses or it may be two signals, one of which is the complement of the other. That is, the pulses are exactly 180° out of phase. The latter arrangement is shown in FIG. 1.

Figure 2:
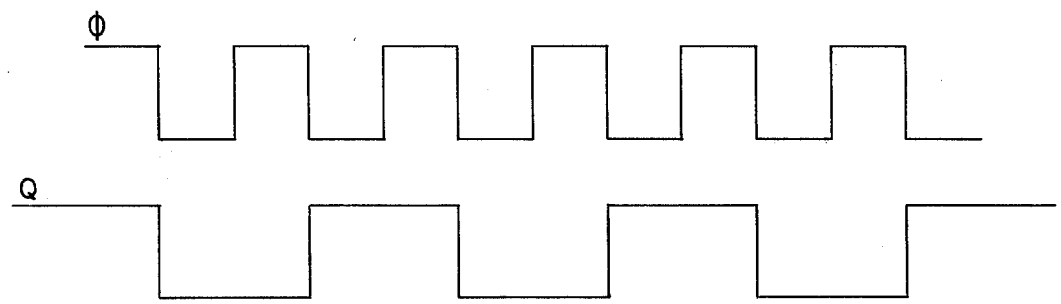
FIG. 2 is a frequency diagram showing the frequency relationship of the input and output of the circuit of the present invention.

The inputs to any given binary circuit 6, for example, are the signal $\phi$ and its complement $\bar{\phi}$. The outputs of the binary are the signal Q and its complement $\bar{Q}$. The relationship of these signals is illustrated in FIG. 2 where it can be seen that Q has a frequency of ½ of that of $\bar{\phi}$. Although not important to the invention, it will aid in its explanation if some conventions are defined. The zero signal level is at ground and the one signal level is at some positive voltage, for example, 3 volts above ground. Q changes state on the trailing edge of $\bar{\phi}$.

Many binarys within the frequency divider network also are provided with a reset signal R, whose purpose is to force the output Q to logic zero when R is high.

Figure 3:
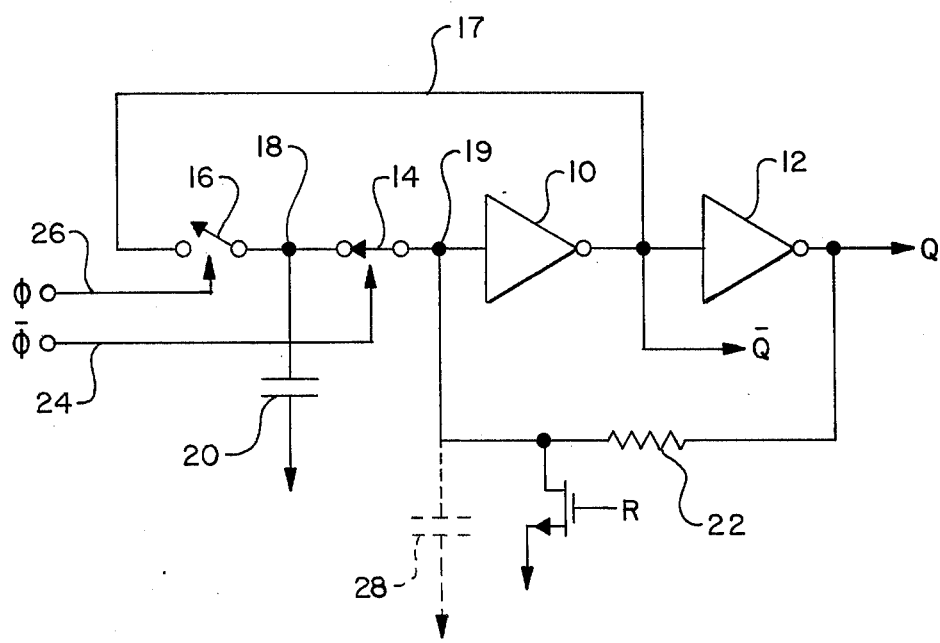
FIG. 3 is a simplified circuit schematic illustrating the basic operation of the circuit.

FIG. 3 shows the basic functional configuration of the binary divider circuit for the present invention. The circuit generally consists of inverters 10 and 12 connected in series. Connected in series with the input of the inverter 10 are switches 14 and 16. The output of inverter 10 is connected to one end of switch 16 via lead 17. The common node 18 between switches 14 and 16 is connected through capacitor 20 to ground. The output of inverter 12 is connected through resistor 22 to the input of inverter 10. Switches 14 and 16 are controlled by electrical signals supplied via leads 24 and 26 respectively. That is, when the signal on lead 26 is high, switch 16 is closed. When the signal on lead 26 is at ground, switch 16 is open (as shown in the diagram). As will be described later, switches 14 and 16 are constructed such that if one is open the other must be closed and vice versa.

Stray capacitance associated with the input to inverter 10 is illustrated as capacitor 28. In order for the circuit to work properly, capacitor 20 must be much greater than capacitor 28.

Inputs $\phi$ and $\bar{\phi}$ are supplied to the circuit via leads 26 and 24 respectively. The outputs from the circuit Q and $\bar{Q}$ are taken from the outputs of inverters 12 and 10 respectively.

Figure 4:
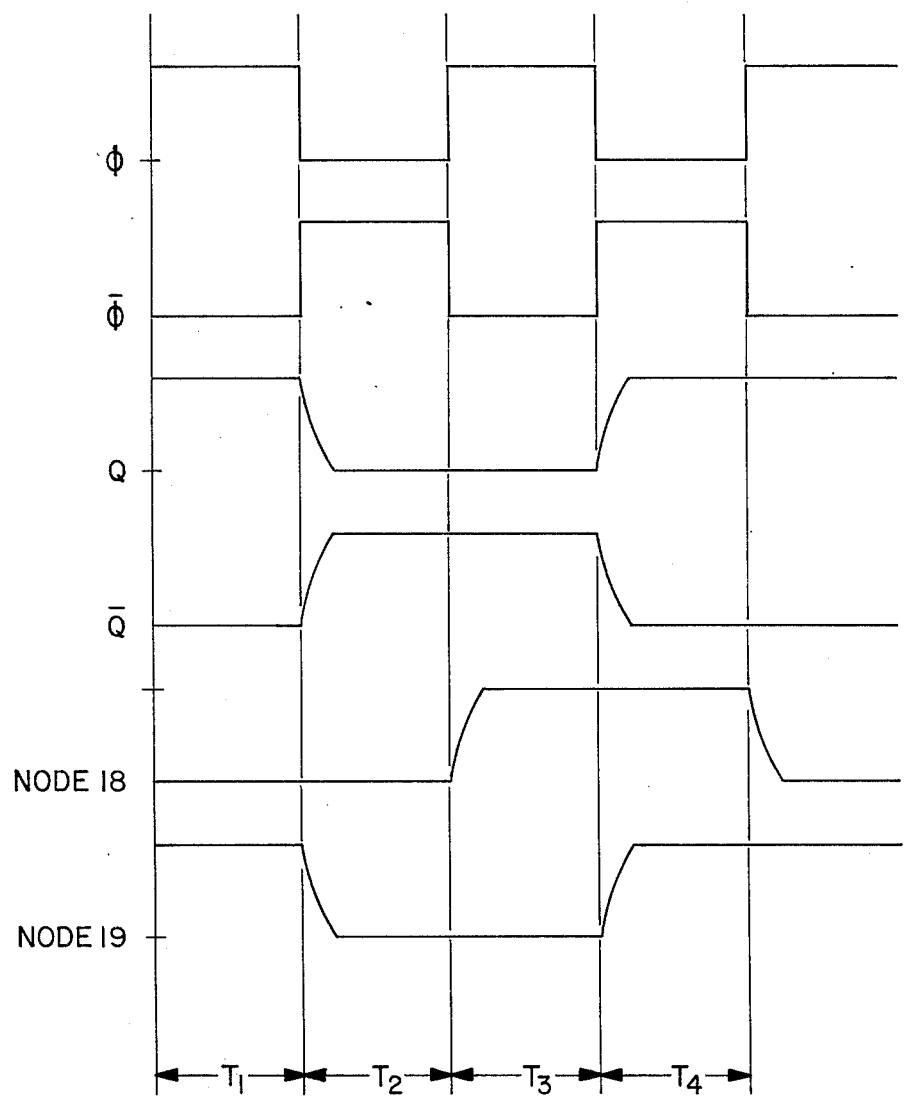
FIG. 4 is a phase diagram showing the relationship of the various inputs and outputs and important nodes within the circuit shown in FIG. 3.

To explain the operation of the circuit of FIG. 3, it is helpful to refer to the phase diagram of FIG. 4. For purposes of description, assume that the input signal $\phi$ is resting between transitions in a logic one state during the time interval $T_1$. $\bar{\phi}$ is, of course, in a logic zero state during this time. Switch 16 will be closed, and switch 14 is open. Also assume, as shown in FIG. 4, that Q is in a logic one during period $T_1$. As can be seen, there is positive feedback around the two inverters from the output of inverter 12 via resistor 22 to the input of inverter 10. Thus, the two inverters will act similar to a flip flop in that they can have only two stable states and will remain in a particular state until they experience an input signal that drives them to the other state.

The latching operation of the two inverters is as follows. With a logic one on the input of inverter 10, the output thereof is at a logic zero and is $\bar{Q}$. Inverter 12 inverts the output of inverter 10 from a logic zero to a logic one, which signal is Q, and is returned via resistor 22 to reinforce the logic one signal on the input of inverter 10. Since switch 14 is open, the remainder of the circuit is isolated from the input of inverter 10 and thus the two inverters will remain latched in a stable state.

With switch 16 closed, node 18 and therefore capacitor 20 is forced to a logic zero state via lead 17 connected to the output of inverter 10.

State $T_1$ may last for any period of time, depending on where the binary divider is located within the watch circuitry. It is triggered only by a change in the state of the preceding binary circuit.

When at time $T_2$ the preceding binary circuit changes state, $\phi$ goes to a logic zero and $\bar{\phi}$ goes to a logic one. This immediately causes switch 16 to open and switch 14 to close. The effect of this switching change is to transfer the change from capacitor 20 through node 18 and now closed switch 14 to the input of inverter 10. Switch 16 is, of course, open so that node 18 is isolated from the output of inverter 10 via lead 17. Prior to $T_2$, node 18 was at zero logic level and the input to inverter 10 was at a logic one level. Now, during the time period $T_2$, the input of inverter 10 is forced to a logic zero level by, in effect, draining the positive voltage from the input of inverter 10 to capacitor 20. Since stray capacitance 28 is much smaller than capacitance 20, the positive charge stored thereon will not defeat the effect of capacitor 20 and the input to inverter 10, which is indicated by reference numeral 19, will be forced to a logic zero level. As soon as node 19 discharges towards the logic zero sufficient to affect the state of inverter 10, the output of inverter 10 will swing in the opposite direction; that is, from a logic zero to a logic one state. Likewise, as soon as the output of inverter 10 has gone far enough towards the logic one state to which it is headed, it will affect inverter 12 and cause the output thereof to swing towards a logic zero state. This signal is in turn fed back via resistor 22 to node 19 to reinforce its change in state and thereby effect a d.c. latching action.

At time $T_3$, $\phi$ and $\bar{\phi}$ again switch with $\phi$ going back to a logic one and $\bar{\phi}$ to a logic zero. In FIG. 3, this causes switch 14 to open and switch 16 to close. The opening of switch 14 isolates node 19 from the rest of the circuit but does not change the input on inverter 10 since there is positive feedback via resistor 22. Thus, the output of both inverters 10 and 12, that is Q and $\bar{Q}$, is not affected, as shown in FIG. 4. However, when switch 16 closes, node 18 and consequently capacitor 20 are charged to the same potential as the output of inverter 10 — in this case — to a logic one. Since switch 14 is now open, the charge on capacitor 20 cannot drain away and the circuit will stay in this state indefinitely so long as inputs $\phi$ and $\bar{\phi}$ do not change.

When input $\phi$ and $\bar{\phi}$ do change, as indicated at time $T_4$ in FIG. 4, the state of the circuit changes as follows: to start with, $\phi$ goes to the zero logic level and $\bar{\phi}$ goes to a logic one level. This causes switch 14 to close and switch 16 to open which in turn causes the positive voltage stored on capacitor 20 to raise input 19 of inverter 10 to a logic one level, which, after suitable time delays, causes the output of inverter 12 to rise to a logic one level and latch via resistor 22.

Reviewing now the operation of the circuit, it can be generally seen that the outputs Q and $\bar{Q}$ make one transition in state for every two transitions of the input $\phi$ and $\bar{\phi}$, and this transition occurs on the trailing edge of $\phi$ and $\bar{\phi}$. To do this, the circuit goes through a sequence of four distinct stable states as a response to changes in $\phi$ and $\bar{\phi}$.

The foregoing circuit has the advantage over other known circuits of requiring only two switches and two inverters to accomplish the function. This is a significant reduction in active circuit elements over other known circuits.

In order for the circuit of FIG. 3 to work properly, capacitor 20 must be much greater than capacitor 28. That is, in typical microelectronic implementations of this circuit, stray capacitance $c_{28}$ is in the order of from 0.2 to 0.5 picofarads. As a result, capacitor 20 must be in the range of 2 to 3 picofarads.

Although this circuit may be implemented by any manner of circuit components, it is very suitable for implementation in complimentary metal oxide semiconductor (CMOS) technology. In any integrated circuit technology, but particularly in CMOS technology, the ability to minimize the physical size of the circuits is of considerable value in that the functional capability per chip can be increased and/or the cost per circuit decreased. It may also be possible to increase the yield.

A circuit of FIG. 3, although it has a very small number of active circuit elements (that is, transistors) does require the use of a resistor and a capacitor. Typically, the use of capacitors has been avoided in CMOS technology because of the excessive amount of chip space that they consume. It is usually more efficient to put in additional active devices than to make a capacitor. However, a significant contribution of the present invention is a CMOS capacitor structure that significantly reduces the surface area required for a given capacitance.

Figure 5:
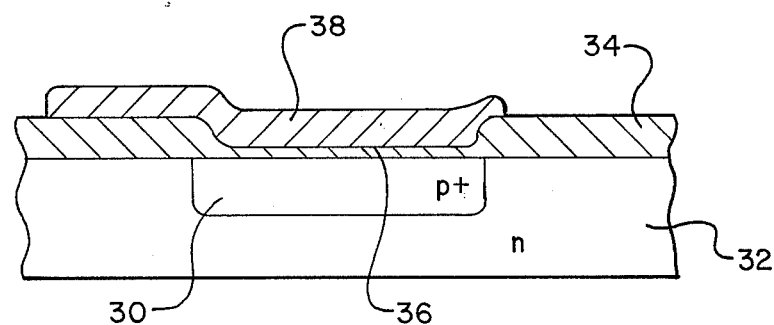
FIG. 5 is a cross-sectional illustration of the structure of a conventional CMOS capacitor.

FIG. 5 illustrates the structure of a conventional CMOS capacitor. There, a p+ diffusion 30 is performed in the bulk silicon 32. The field oxide layer 34 of 10,000 Angstroms is thinned down to a gate odxide layer 36 having a thickness of 1,000 Angstroms. The p+ diffusion 30 acts as one electrode of the capacitor and a metallization layer 38 acts as the other electrode.

Capacitors of this type yield a capacitance per square mil of approximately 0.2 to 0.4 picofarads with 0.2 being more common. Assuming the yield to be 0.2 picofarads per square mil, it would require 10 square mils of chip surface area to make capacitor 20 in FIG. 3. In microelectronic terms, this is quite a large area, particularly if the circuit is repeated many times in a large array.

Figure 6:
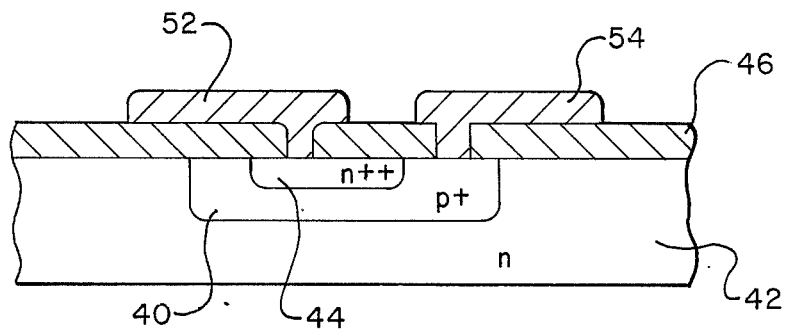
FIG. 6 is a cross-sectional illustration of a CMOS capacitor constructed according to the present invention.

The capacitor of the present invention is illustrated in FIG. 6. There a p+ diffusion 40 is made into an n-doped substrate 42. Within the p+ region, an n+ or n++ region 44 is diffused. These diffusions are made by conventional microelectronic techniques and the p+ and n++ designations merely indicate a high level of doping concentration which is also conventional in the industry. After diffusion, a thick layer of field oxide 46 is deposited. Contact holes 48 and 50 are formed in the conventional manner to reach regions 40 and 44. Suitable metalization 52 and 54 is deposited to make electrical contact with regions 40 and 44. This structure provides an n++ and p+ junction which, of course, forms a conventional diode. However, if this structure is reverse biased, it forms a good capacitor. Indeed, this structure yields a capacitance per square mil of approximately 1 to 1.2 picofarads and has the additional advantage of requiring a very small amount of metalization. Thus, metalization for other elements of the circuit may run over the top of parts of the capacitor without interfering with its operation which is in contrast to the structure of the conventional capacitor of FIG. 5.

Figure 7:
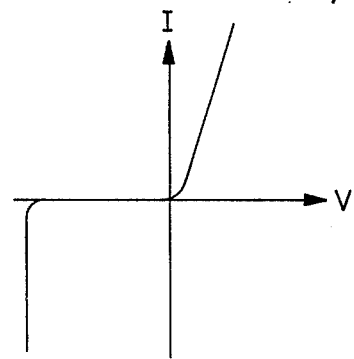
FIG. 7 is a voltage current diagram illustrating the operation of the capacitor of FIG. 6.

An additional advantage of this structure is that it is easy to implement with the CMOS process. In a conventional CMOS process, there is a well diffusion, a p+ diffusion and an n++ diffusion. Thus, there are naturally diffusions of the right polarity and doping concentration. This structure capacitor has not been used in CMOS design before now because of its very low reverse breakdown voltage. This can best be understood by referring to FIG. 7 which is a typical current voltage diagram where V is the voltage applied to the p+ diffusion and the n++ diffusion is connected to ground. When the voltage V is positive, the diode is forward biased and the impedance across the diode is close to zero. When V is negative, the diode is reverse biased and the impedance is very high out to a breakdown voltage of approximately 6 to 7 volts.

In more conventional CMOS circuit applications, the supply voltage is in the range of 5 to 15 volts. Thus, using capacitors of this structure would have been unthinkable. However, with very low voltage applications in the range of 3 volts or lower, this structure will work and is very desirable.

Resistor 22 of FIG. 3 must be of a high value, in the range of 500,000 to 1,000,000 ohms. This is necessary because of the switching action of the circuit. When the charge on capacitor 20 is supplied to node 19, first inverter 10 and then inverter 12 will go through a change of state. However, during the delay, this signal could discharge through resistor 22 to the output node Q which is at the opposite logic level. The mathematical relationship that must be satisfied is as follows:

$R_{22} \times C_{20}$ must be much greater than $\tau_i$ where $\tau_i$ is the delay time through inverters 10 and 12. Typically, $\tau_i$ is of the order of 200 nanoseconds. Thus, for safe circuit operating conditions, $R_{22} \times C_{20}$ must be greater than 2 microseconds. With $C_{20}$ having a value of 2 picofarads, R must be $10^6$ ohms. Resistors formed in a conventional integrated circuit manner of the size required would be much too large to be economic. As a result, ion implanted resistors are used. Ion implantation is well known in the art and is typically used in CMOS technology for other steps.

Figure 8:
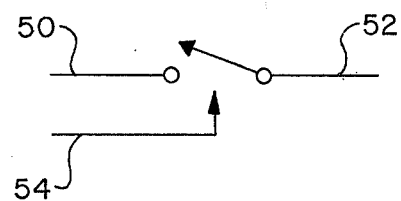
FIG. 8 is a conventional illustration of the switch of FIG. 3.
Figure 9:
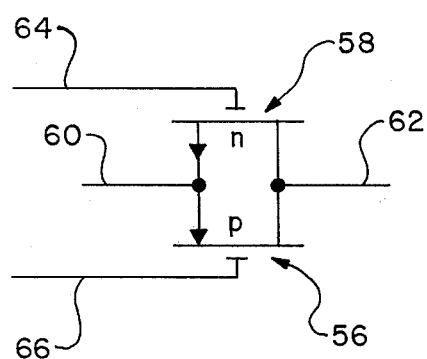
FIG. 9 is a circuit schematic of the switch of FIG. 8 implemented in CMOS technology.

The implementation of switches 14 and 16 in CMOS technology can best be understood by referring to FIGS. 8 and 9. FIG. 8 shows a basic switch having terminals 50 and 51 and a control terminal 52. Again, the convention is used that when a logic one signal is present on control 54, the switch is closed between terminals 50 and 52. This structure is implemented in the CMOS technology as illustrated in FIG. 9 by using a p-channel transistor 56 and an n-channel transistor 58 whose sources are joined and correspond to terminal 50 and whose drains are joined and correspond to terminal 52. The gate of the n-channel transistor corresponds to control terminal 54 and the gate of the p-channel transistor must be provided with a signal which is the complement of the signal on gate 54. In the case of the present application, the complementary signal is always provided. In other applications, an inverter connecting the two gates must be provided.

Figure 10:
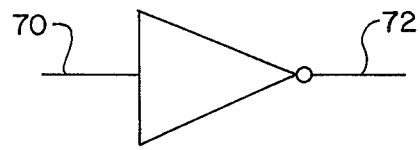
FIG. 10 is a schematic illustration of an inverter circuit.
Figure 11:
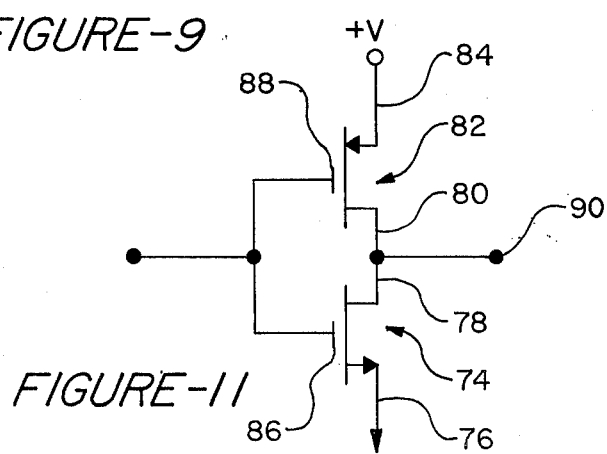
FIG. 11 is a schematic of the inverter of FIG. 10 implemented in CMOS technology.

To understand the implementation of inverters 10 and 12 in the CMOS technology, refer to FIGS. 10 and 11. FIG. 10 is symbolic of an inverter having an output 70 and an output 72 which is the inverse of the input.

The implementation of this circuit in CMOS is accomplished by an n-channel transistor 74 having its source 76 connected to ground and having its drain 78 connected to the drain 80 of a p-channel transistor 82 whose source 84 is connected to a positive source of voltage. The gates of the transistors 86 and 88 are tied together and form the input corresponding to input 70 in FIG. 10. The output of the circuit is taken at node 90 and corresponds to the output 72 in FIG. 10.

What is claimed is:
1. A binary divider circuit for generating an output signal having a frequency of one-half that of its input signal, comprising:
first and second inverters connected in series;
first and second switch means connected in series, from the input to the output of said first inverter;
means for opening or closing said switches in response to said input signal such that said switches operate 180° out of phase;
a capacitor connected to the common node between said switches, said capacitor being large with respect to any stray capacitance on the input to said first inverter; and
resistor feedback means connected from the output of said second inverter to the input of said first inverter, for referencing said second inverter output to said first inverter input, said resistor being of such value that the time constant associated with said resistor and said capacitor is large with respect to the signal propagation delay through said inverters.

2. The circuit of claim 1 implemented in CMOS technology wherein said capacitor comprises a reverse biased p+, n++ junction with said junction never connected to a voltage that exceeds its breakdown voltage.

3. The circuit of claim 2 wherein said resistor means is formed by ion implantation.

4. The circuit of claim 3 wherein said input signal consists of a first and second train of pulses 180° out of phase and characterized by a first and second distinct voltage level, said circuit further including means for operatively connecting said first train of pulses to said first switch whereby said switch is open when said pulse is at said first level and closed when it is at said second level, means for connecting said second train of pulses to said second switch such that said second switch is open when said pulse is at the first state and closed when said pulse is at a second state whereby said first and second switches are opened and closed 180° out of phase with each other.

5. The circuit of claim 4 further including first output means connected to the output of said second inverter and second output means connected to the output of said first inverter.

6. The circuit of claim 1 wherein said first and second inverters consist respectively of an n-channel MOS transistor having its source connected to ground, a p-channel MOS transistor having its source connected to a positive source of voltage and its drain connected to the drain of said n-channel transistor, the gates of said transistors connected together and forming the input to said inverter, said output means connected to the common node between the drains of said n-channel and p-channel transistors.

7. The circuit of claim 6 wherein said first and said second switches comprise respectively: an n-channel and p-channel MOS transistor having their sources and drains connected; input means connected to the gates of said transistors such that a control signal is supplied to one gate and the complement of said signal is supplied to the other gate thereby said switch is closed and a signal may be passed from said common drain connection through said transistors to said common source connection when said first level signal is impressed upon said gates but whereby a signal may not pass from said common drain to said common source through said transistors when said second level signal is impressed upon said gates.

* * * * *